United States Patent [19]

Machida et al.

[11] Patent Number: 4,770,680
[45] Date of Patent: Sep. 13, 1988

[54] WAFER CARRIER FOR A SEMICONDUCTOR DEVICE FABRICATION, HAVING MEANS FOR SENDING CLEAN AIR STREAM TO THE WAFERS STORED THEREIN

[75] Inventors: Akira Machida, Kawasaki; Akira Abiru, Yokohama, both of Japan

[73] Assignee: Fujitsu Limited, Kanagawa, Japan

[21] Appl. No.: 48,350

[22] Filed: May 11, 1987

[30] Foreign Application Priority Data

May 19, 1986 [JP] Japan ............................ 61-115391

[51] Int. Cl.⁴ .............................................. B01D 50/00
[52] U.S. Cl. ................................... 55/385.1; 55/473;
   55/DIG. 18; 55/DIG. 29; 98/115.3; 312/223
[58] Field of Search ................ 55/385 A, 385 R, 473,
   55/DIG. 29, DIG. 18; 98/115.3; 269/21;
   312/223, 31; 432/6

[56] References Cited

U.S. PATENT DOCUMENTS

| | | | |
|---|---|---|---|
| 3,834,349 | 9/1974 | Dietze et al. | 211/41 |
| 4,037,830 | 7/1977 | Poluzzi et al. | 55/385 A |
| 4,228,902 | 10/1980 | Schulte | 211/41 |
| 4,412,849 | 11/1983 | Shahani | 98/115.3 |
| 4,557,184 | 12/1985 | Orii et al. | 98/115.3 |
| 4,660,464 | 4/1987 | Tanaka | 55/385 A |
| 4,666,429 | 5/1987 | Shoji | 55/385 R |

FOREIGN PATENT DOCUMENTS

| | | | |
|---|---|---|---|
| 134238 | 10/1980 | Japan | 98/115.3 |
| 59-39019 | 3/1984 | Japan | |
| 59-172713 | 9/1984 | Japan | |
| 60-206017 | 10/1985 | Japan | |

Primary Examiner—Bernard Nozick
Attorney, Agent, or Firm—Armstrong, Nikaido, Marmelstein & Kubovcik

[57] ABSTRACT

A compact wafer carrier for storing spaced semiconductor wafers in parallel with each other, is provided for fabrication processes of a semiconductor device requiring a high particulate contamination control. The wafer carrier has an air cleaning device, including a secondary battery as a power source, a motor fan, and a particulate air filter, and a storing chamber directly connected to the air cleaning device for storing the wafers. The storing chamber has a first opening for receiving the filtered air flow, and a second opening for loading and unloading the wafers, both openings facing each other. As a result, the major part of the filtered air flows in a laminated stream passing along the surfaces of the wafers stored with a fairy high speed, serving to protect the wafers from the intrusion of the particles contained in the environmental air, and removing the particles originally adhered to the surfaces of the wafers.

9 Claims, 6 Drawing Sheets

WAFER CARRIER FOR A SEMICONDUCTOR DEVICE FABRICATION, HAVING MEANS FOR SENDING CLEAN AIR STREAM TO THE WAFERS STORED THEREIN

BACKGROUND OF THE INVENTION

The present invention relates to a wafer carrier used in a semiconductor device fabrication system. Particularly, it relates to a compact wafer carrier used in a semiconductor fabrication process, always sending a high class clean air laminated stream directed to the wafers stored thereinside.

In line with the increase in the integration density of semiconductor devices, such as LSIs, the circuit pattern sizes of the semiconductor devices continue to decrease down to submicron sizes. Accordingly, particulate contamination caused by particles and chemicals contained in the fabricating environment, leads to the degradation of the reliability of the fabrication yields of the semiconductor devices. The particulate contamination control of the fabricating environment, therefore, is essential to the fabrication process of the semiconductor device. In order to secure clean fabrication environment, the fabrication processes are generally performed in clean rooms, employing clean benches for work stations of the improtant processes.

As well known, during major part of the earlier fabrication stages of the semiconductor devices, the processes are performed with works which are in the form of semiconductor wafers (hereinafter, referred to as simply 'wafers'). Thereby, a plurality of the wafers, are loaded in a wafer carrier, carried from a work station to the next work station, and unloaded from the wafer carrier to be subject to the next fabrication processes. In several cases, the wafers which are loaded in the wafer carrier, are stored temporarily, for example, in a closed clean box prepared in the relevant working area, for waiting for the next fabrication step.

In some fabrication processes, such as water rinsing and wet chemical etching, the wafers are processed without being unloaded from the wafer carrier, which is utilized as a holding jig of the wafers. In all cases, it is substantially important to protect the wafers from the particulate contamination.

The major source of the particulate contamination in the air is personnel. In fact, if a clean room is continuously monitored for particulate contamination, the monitor record clearly shows the extremely low levels of the particulate contamination that occurs between shifts, and the rapid rise in particle counts that occur as personnel occupy the room. Particularly, when the wafers are carried by an operator employing a prior art wafer carrier, or when the wafers are loaded or unloaded from the wafer carrier manually at a work station, the wafers are exposed to a serious particulate contamination because a human body is in the proximity of the wafers, and the prior art wafer carrier is usually of an open type.

FIG. 1 is a perspective view of an example of the prior art wafer carriers, illustrating the structural configuration thereof. The wafer carrier 6 comprises side plates 1a and 1b which stand facing to each other. A plurality of horizontal and spaced gooves 2a and 2b are respectively formed on the inner surfaces of the side plates 1a and 1b. The grooves 2a, or 2b, are respectively in parallel with each other, being spaced from each other by a predetermined distance such as 2 to 5 mm. A pair of a groove 2a and a groove 2b which correspond to each other, are aligned with each other, and have an appropriate depth such that both grooves 2a and 2b are adaptable to receive the peripheral edge sides of a wafer 5. Thus, the wafers 5 are held in parallel between the side plates 1a and 1b, keeping the spacing distance therebetween. Both side plates 1a and 1b are connected by a top plate 3 at the upper ends having the same width as that of the side plates 1a and 1b. At the bottom ends of the side plates 1a and 1b, a bottom plate 4 (not shown) having a narrow width, connects both side plates 1a and 1b. With this configuration, the prior art wafer carrier 6 has openings at the front side, the rear side, and the bottom side. These openings allow the loading and unloading of the wafers 5 into and from the wafer carrier 6 without any spatial limitation. However, the intrusion of particles, particularly caused by personnel, into the area immediately surrounding the wafers 5, is inevitable, causing a particulate contamination of the wafers 5.

FIG. 2 is a schematic perspective view of an interface means 30 for unloading the wafers 5 from the wafer carrier 6 by one piece and feeding the wafer 5 onto a processing station, which is currently employed. The means 30 includes an elevator 31 and a belt conveyer 32 which is driven by a motor 33. The height of the belt conveyer 32 is formed substantially thin such that the belt conveyer 32 is easily inserted at the bottom of the stored wafers 5 in the wafer carrier 6 without occupying a large space. The elevator 31 (only a mounting plate thereof is shown in FIG. 2) is controllably moved in the vertically direction (indicated arrow V) and in the horizontal direction (indicated by arrow H), mounting the wafer carrier 6 on the mounting plate. With the interface means 30, by operating the elevator 31, the wafer 5 is placed on the belt conveyer 32, pulled out from the wafer carrier 6, thus is unloaded easily one by one from the bottom. Thereafter, the wafer 5 is transferred by the conveyer 32 and loaded into the work station of the subsequent fabrication process (not shown) which is usually performed in a clean bench. The unloaded wafers 5, therefore, are free from further contamination during the loading and unloading operation from the wafer carrier 6 to a work station. Thereby, if the wafer carrier 6 has a bottom plate 4 with the narrow width covering a partial bottom surface of the storing chamber 7, the unloading operation of the wafer 5 is provided much spatial freedom. However, even though with a bottom plate 4 with the wide width covering the full surface of the bottom, the unloading is also possible. Instead of the above-described interface means 30, various means are available, such as an articulated robot.

On the other hand, chemical interaction with the wafers due to particulate contamination has become a problem in recent semiconductor devices. For example, even after a dry etching process of a wafer using a reactive ion etching (RIE) method, residual radial ions, such as fluoride radicals, are prone to adhere to the surface of the wafer, chemically reacting with the wafer, and providing damages to a circuit pattern formed on the wafer, such as an excess side etching of the relevant pattern. Such chemical particulate contamination is also desirable to be eliminated. The elimination, however, can not be achieved by only statically immersing the wafers in a clean air environment, becasue the adhesion power of the radicals to the surfaces of the wafers is too strong to be released from the surface by stagnant air flow.

There are utilized a wafer carrier of closed type, in which wafers stored in the wafer carrier are protected from the particulate contamination by an air-tight shield case. Although intrusion of the particles contained in the environmental air space can be avoided by the shield, the above-described adhereed chemical radicals, for example, can not be removed from the surfaces of the wafers. In view of the above described chemical aspects of the particulate contamination, the closed type wafer carrier is not effective to eliminate the damage. In addition, the structure including the air-tight shield, provides substantial inconvenience to the loading and unloading of the wafers.

Furthermore, in the fabricating field of semiconductor devices, there are proposed various means for storing wafers, and carrier means for transferring wafers, which are equipped with a clean air supplying means. Several examples will be introduced.

A clean retainer is proposed in Japanese Provisionally Published Patent Application, No.59-39019, published on Mar. 3, 1984, invented by Suzuki et al. The retainer has an air cleaning means including an air filter for supplying clean air therein, which flows from the top side of the retainer to the down side. The wafers stored in a wafer cassette are disposed at the bottom of the retainer. Thus, the wafers may be exposed to clean but stagnant air flow. The retainer is not transportable according to the drawing of the embodiment. A portable clean box is proposed in Japanese Provisionally Published Patent Application, No. 59-172713 published on Sept. 29, 1984, by Nishigatani. The box is compact and portable, and the inside of the box is pressurized by high pressure clean air stored in a small reservoir. No description how to store wafers therein, is found. Further, a clean transferring system is proposed in Japanese Provisionally Published Patent Application, No.60-206017 published on Oct. 17, 1985, invented by Kuno, et al. The system contains a wagon having an air cleaning means to maintain the air space inside the wagon clean. The cleaning means includes a fan, a filter, and a recirculating duct. The wafers are stored on a cassette, and placed on a belt conveyer. The clean air may be stagnant in the space surrounding the wafers which is disposed at the bottom of a storing space. In the above-described clean air vessels having each own air cleaning means, the air flow may stagnate on the surface of the wafers stored, resulting in difficulty in removing particulate contamination originally adhering to the surface of the wafers.

SUMMARY OF THE INVENTION

It is an object of the present invention to provide a compact and transportable wafer carrier, having an opening for loading and unloading semiconductor wafers and a means for sending clean air stream directed toward the wafers stored inside.

It is another object of the present invention to provide a wafer carrier, in which semiconductor wafers stored therein are subject to laminated clean air stream flowing along the surfaces of the wafers with a speed sufficient to remove particles adhered to the surface of the wafers.

The above-described objects are achieved by a wafer carrier according to the present invention. The wafer carrier comprises a storing chamber and an air cleaning means. The storing chamber has a loading and unloading opening of the wafers, and an air inlet opening, both of which face each other and have approximately equal opening area. Between the openings, a storing space for storing wafers of a plurality number, such as 25 pieces, for example, is formed. The side of storing chamber except both openings is enclosed by a housing, composed of top plate, side plates, and bottom plate such that the clean air flows in a laminated stream state from the air inlet opening to the loading and unloading opening. The wafers are stored in the storing chamber in parallel with each other and spaced by a distance from each other. The wafers are placed such that the clean air stream flows along the wafer surfaces with a considerable speed, removing the particulate contaminations originally adhered to the surface of the wafers, and prohibiting the intrusion of the particles contained in the external air space surrounding the wafer carrier.

The air cleaning means comprises air motor fan, an electrical power source, a secondary battery, a filter, and a housing having an air outlet opening. The air oulet opening is coupled with the air inlet opening of the storing chamber. Thus, the air cleaning means can supply clean air stream into the storing chamber continuously during transferring or storing the wafers therein.

The details and advantages of the present invention will be apparent from the following embodiments and attached claims with reference to the drawings, wherein like reference numerals designate like parts.

DESCRIPTION OF THE PREFERRED EMBODIMENTS

Figure 1:
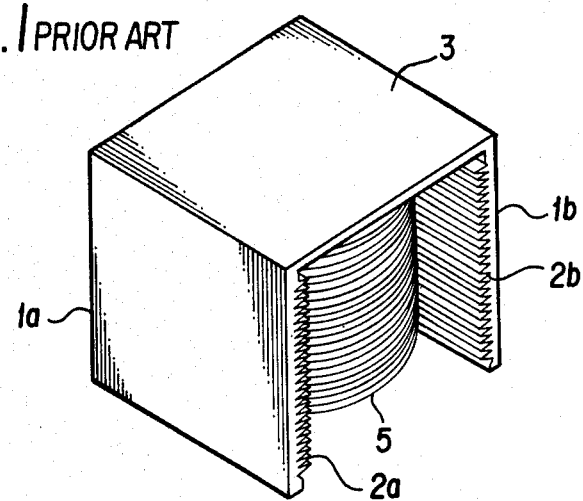
FIG. 1 is a perspective view of an example of the prior art wafer carriers, illustrating the structural configuration thereof.
Figure 2:
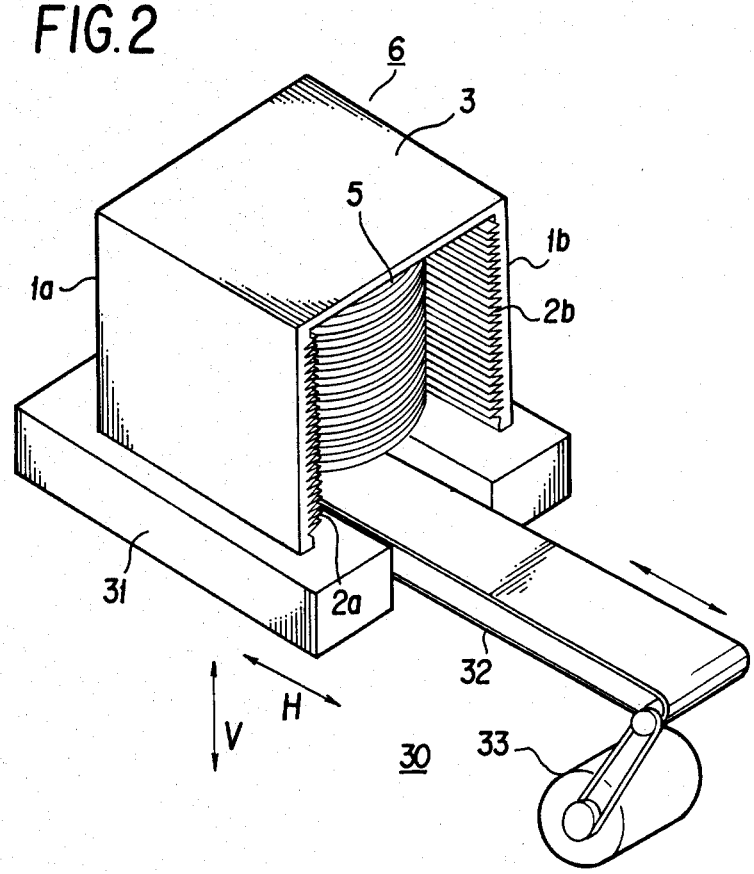
FIG. 2 is a schematic perspective view of an interface means for unloading the wafers from the wafer carrier.
Figure 3:
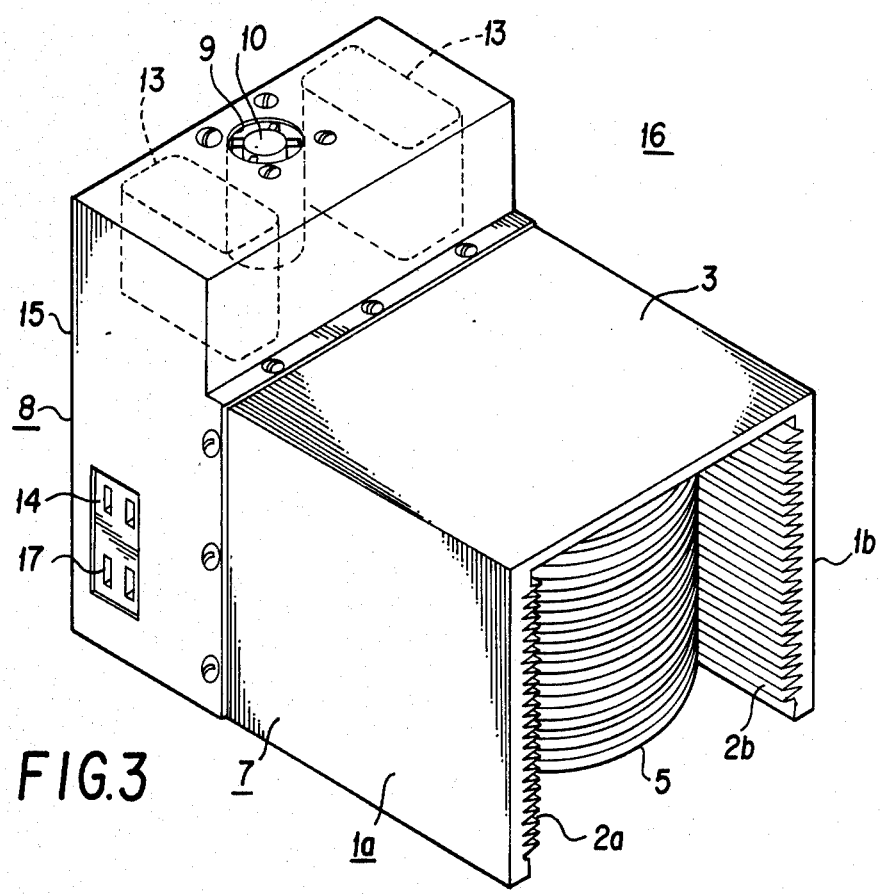
FIG. 3 is a perspective view of a first embodiment of the present invention, illustrating the structural configuration thereof.
Figure 4:
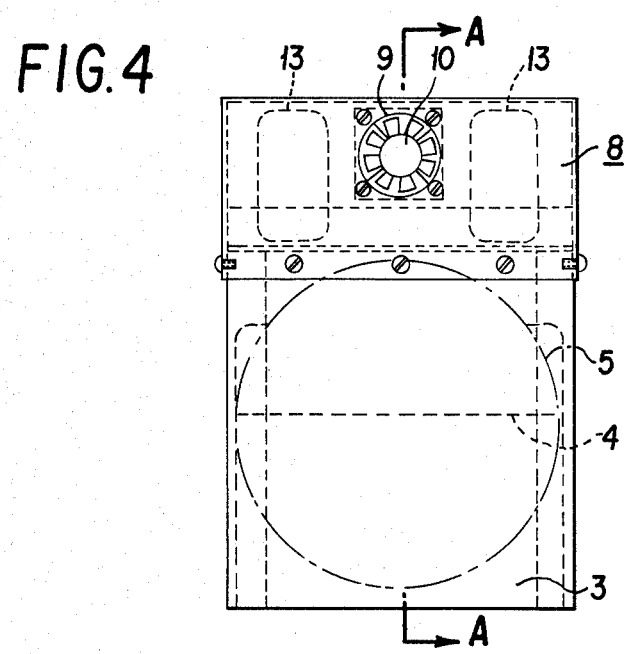
FIG. 4 is a top view of the first embodiment of FIG. 3.
Figure 5:
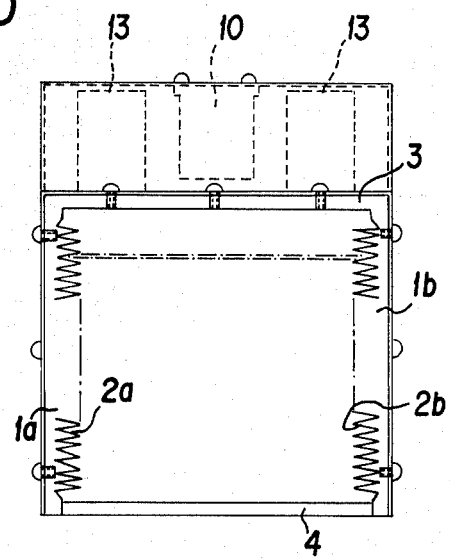
FIG. 5 is a front view of the first embodiment.
Figure 6:
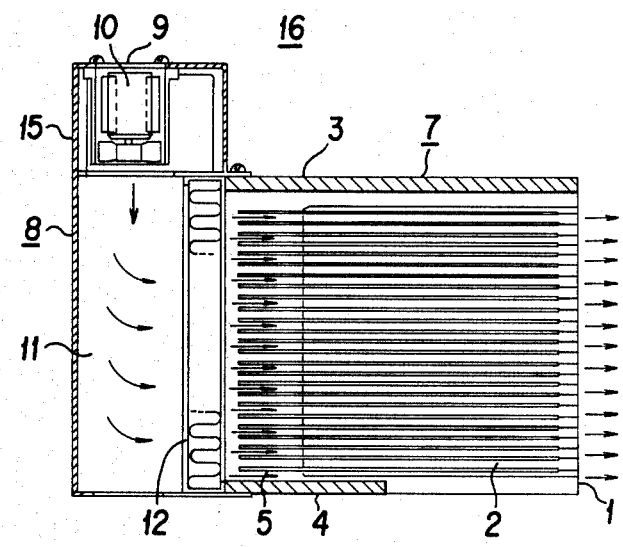
FIG. 6 is a cross-sectional side view of the first embodiment, taken along line A—A shown in FIG. 4.

FIG. 3 is a perspective view of a first embodiment of the present invention, for storing 6 inches silicon wafers, illustrating the structural configuration thereof. FIG. 4 is a top view of the embodiment, FIG. 5 is a front view of the same, and FIG. 6 is a cross-sectional side view taken along line A—A shown in FIG. 4. The wafer carrier 16 comprises a storing chamber 7 and an air cleaning means 8. The storing chamber 7 has a structural configuration similar to that of the prior art wafer carrier 6 shown in FIG. 1. Side plates 1a and 1b stand facing to each other, forming a storing space therebetween for storing the wafers 5. Horizontal grooves 2a and 2b are formed on the inner surfaces of the side plates 1a and 1b in the same manner as those of FIG. 1. Thereby, the cross-section of the grooves 2a and 2b is V-shaped which serves to minimize contacting area between the groove surfaces and the edges of the wafers 5 inserted therein, in a short line contact. The depth of the grooves 2a and 2b is selected such that both grooves 2a and 2b are adaptable to receive the sides of the wafers 5. Thus, the wafers 5 are held in parallel and horizontally between the side plates 1a and 1b, namely in the storing space, keeping the spacing distance therebetween. The storing space is surrounded by a top plate 3, side plates 1a and 1b, and a bottom plate 4. Generally, the bottom plate 4 has a narrower width than that of the side plates 2a and 2b for the convenience for loading and unloading of the wafers 5. With this configuration, the storing chamber 7 has openings at the front side, and the rear side. The front opening serves to load and unload the wafers 5, and an outlet of a clean air stream. The rear opening serves to introduce clean air stream which is sent by the air cleaning means 8. The material of the storing chamber 7 is selected from silica, polypropylene, PFA (copolymer of tetrafluoroethylene perfluoro alkyl vinyl ether) and the like.

As illustrated in the figures, the air cleaning means 8 includes a motor fan 10, a vertical air duct 11, air filter 12, an electrical power source, usually a secondary battery 13, and a housing 15 forming the vertical air duct 11. Air is taken in by the motor fan 10 onto the duct 11 through an air inlet opening 9 which is opened in a part of the top plate of the housing 15. The air cleaning means 8 has an air outlet opening for sending an air stream out, which is formed on a vertical side of the duct 11 and has the same shape as that of the air inlet opening of the storing chamber 7. Both openings are coupled to each other permanently or demountable by a coupling means (not shown in FIG. 3, 4 and 5, but shown in FIG. 7 which will be referred later). A DC motor fan 10 (rating voltage DC 12V, power consumption 1.8 W, maximum spending air capacity 0.45 m$^3$/min, static pressure 13 mmAq) is disposed at the upper side of the vertical duct 11, and two nickel-cadmium (NiCd) secondary batteries 13 (output voltage DC 12V, capacity 0.5 Ah) are disposed at both sides of the motor fan 10. The secndary batteries 13 are charged occasionally by an external battery charger (not shown) through a charging socket terminal 14 disposed on the surface of the housing 15 as shown in FIG. 3. For a practical use, another socket, a driving socket terminal 17, is also disposed besides the charging socket terminal 14, for driving the motor fan 10 by the application of an external power source (not shown) for saving the discharge of the secondary battery 13. The relevant circuitry (not shown) is formed on th einner side of the housing 15, operatively connecting the motor fan 10, secondary batteries 13, and socket terminals 14 and 17, description of which is omitted.

A 0.1 μm HEPA (high efficiency particulate air) filter 12, a product of NITTA Co., is disposed across the air outlet opening to filter the air sent through the vertical duct 11. The collection efficiency for the particles of 0.1 μm size is above 99,999%, and the filter pressure drop at the air flow rate of 0.2 m$^3$/sec. is below 20 mm Aq.

With the above-described structural configuration of the wafer carrier 16, air flow generated by the motor fan 10 flows into the vertical duct 11, filtered by the HEPA filter 12, and is sent into the storing chamber 7 wherein the wafers 5 are placed horizontally and spaced from each other. Because the flow resistance of the vertical duct 11 is fairly lower than that of the filter 12, and the side of the storing chamber 7 is enclosed by the side plates 1a, 1b, and top plate 3, and is partially closed by the bottom plate 4, the filtered clean air is distributed almost uniformly along the filter surface, and flows along the surfaces of the wafers 5 as indicated by arrows in FIG. 6 with a fairy high speed such as 0.1 m/sec to 0.2 m/sec. Major part of the air flows between the wafers 5 forming laminated air stream without any turbulence, stagnation, and eddy. The positioning of the side plates 1a and 1b in the extreme vicinity of the ends of the wafers 5, also serves to form the laminated, high speed clean air stream.

The motor fan 10 can be kept driven during the whole time when the wafers 5 are stored inside the wafer carrier 16. As a result, the wafers 5 are completely protected from any particulate contamination, even though personnel exist in the vicinity of the wafers 5. In addition, the particulate contamination originally adhered to the surfaces of the wafers 5 are also effectively removed by holding the wafers 5 in the wafer carrier 16 for a period.

The effectiveness of the wafer carrier 16 according to the present invention, which is shown in FIG. 3, is measured. In an environment of over Class 1,000,000 of Federal Standard No.209b, the wafer carrier 16 is placed and the motor fan 10 was operated. At the starting moment of the measurement, of course, the storing chamber 7 of the wafer carrier 16 is filled with the air of the environment.

(a) After 30 seconds operation, the resulted cleanness inside the storing chamber 7 of the wafer carrier 16 was measured. At the center portion, the cleanness was below 3 (0.1μ class), and at the peripheral portion spaced from the side plate 1a and 1b by 10 mm, below 10. This means that the number of particles larger than 0.1 μm contained in the storing chamber 7 is below 1. (the volume of the storing chamber 7 is approximately 0.1 cubic feet).

(b) 25 pieces of 6 inches silicon wafers 5 were stored in a wafer carrier 16 according to the present invention and the same number of the wafers 5 in a prior art wafer carrier 6, at the same time, for 72 hours, in a clean room of Class 1000 where operators were working. The number of the particles with sizes larger than 0.2 μm, attached to the surfaces of the wafers, were measured. The original numbers of the particles attached to the surfaces of the wafers 5 ranged from 0 to 30. The increase in the number of the particles after 72 hours, was 16 per wafer in average for the new wafer carrier 16, and 1600 for the prior art wafer carrier 6.

Figure 7A:
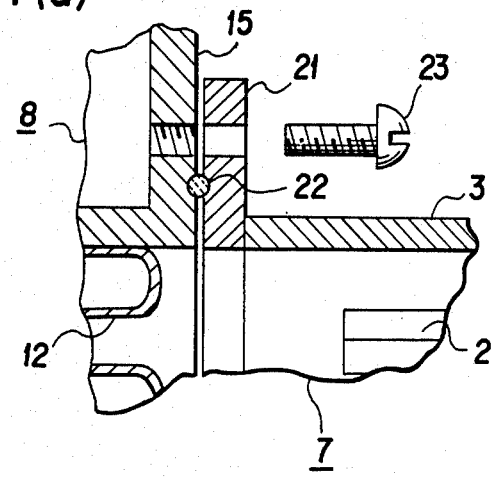
FIG. 7 (a) and FIG. 7(b) are cross-sectional views of a coupling means for coupling the wafer storing chamber 7 and the clean air supplying means 8 of the first embodiment.
Figure 7B:
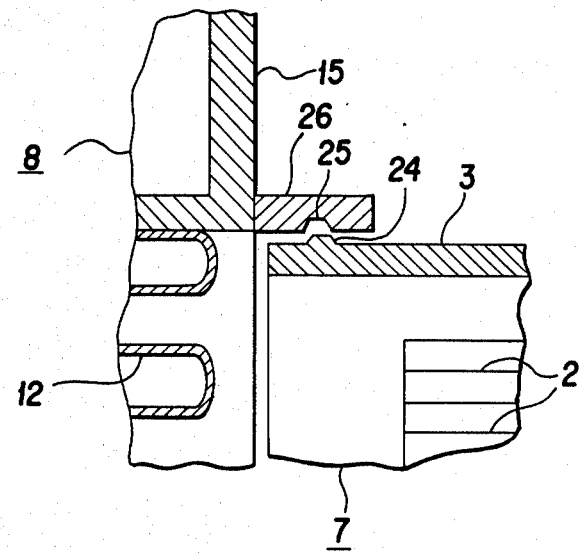

FIG. 7 (a) and FIG. 7(b) are partial cross-sectional views of the coupling means for coupling the wafer storing chamber 7 and the air cleaning means 8. These coupling mechanisms are popular ones. FIG. 7(a) illustrates partially the structure of a permanent coupling, comprising a flange 21 disposed around the edge portion of a housing comprising top plate 3, side plates 1a, 1b, and bottom plate 4. The flange 21 is coupled to the air outlet opening of the air cleaning means 8, by screwing the flange 21 to the housing 15 with screws 23. An 0 ring 22 is inserted at the coupling contact to increase the air-tightness of the coupling. In stead of the use of the above-described structure, a direct welding method is applicable for the permanent coupling.

FIG. 7(b) is a cross-sectional view, illustrating a partial structure of a demountable coupling. A coupling sleeve 26 is disposed on the outer surface of the housing 15 of the air cleaning means 8, along the edge of the air outlet opening. The inner side surface of the coupling sleeve 26 is formed so as to fit with the outer side surface of the above described housing surrounding the storing space of the storing chamber 7. Demountable coupling between the sleeve 26 and the housing is achieved by inserting the protrusions 24 formed on the outer side surface of the housing into the corresponding pits 25 formed on the inner side surfce of the sleeve 26, utilizing the elastic deformation of the relevant parts. With such demountable structure, the storing chamber 7 is separated from the air cleaning means, and can be utilized as a wafer cassette for wet etching process and the like.

Figure 8:
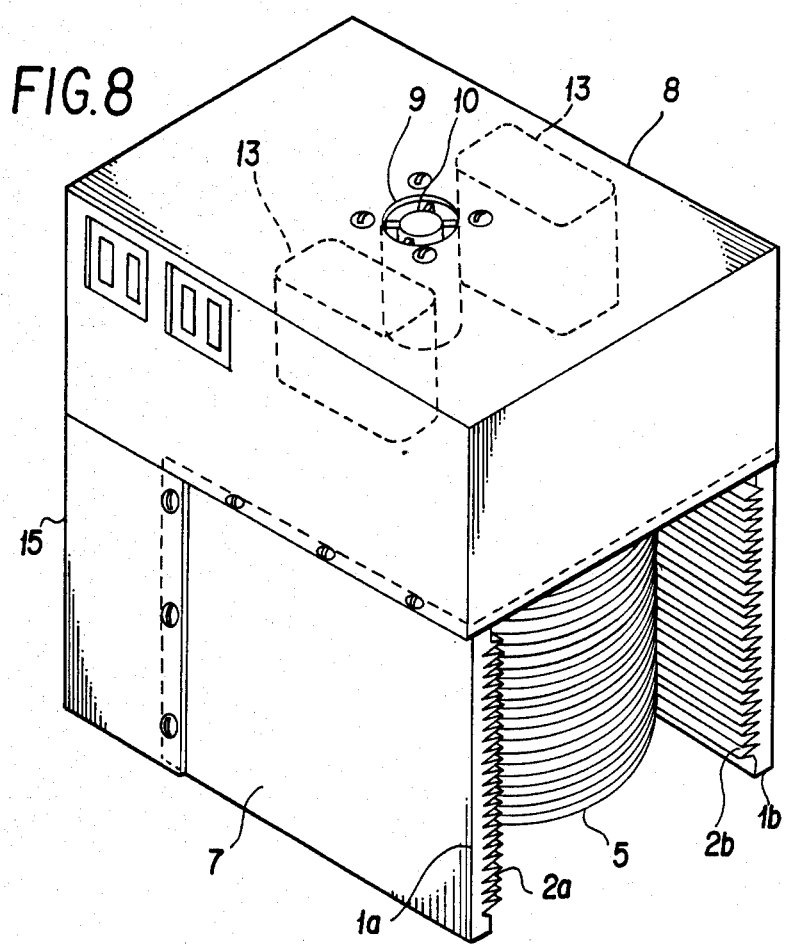
FIG. 8 is a perspective view of a second embodiment, illustrating the structural configuration thereof.
Figure 9:
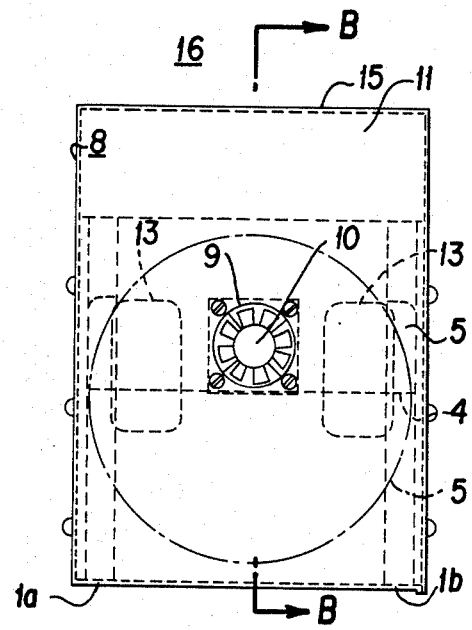
FIG. 9 is a top view of the second embodiment.
Figure 10:
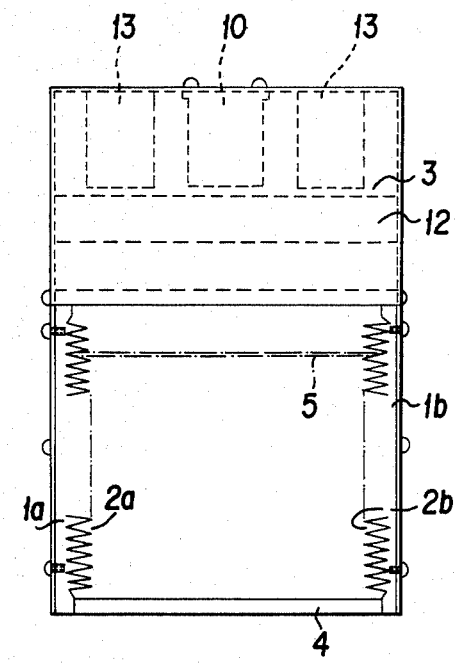
FIG. 10 is a front view of the second embodiment.
Figure 11:
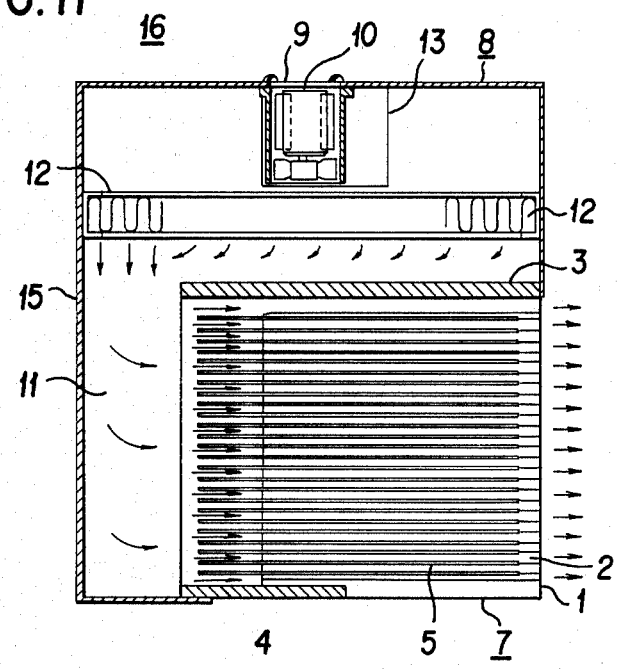
FIG. 11 is a cross-sectional side view of the second embodiment, taken along line B—B designated in FIG. 9.

FIG. 8 is a perspective view of a second embodiment having a modified structure of that of the first embodiment shown in FIG. 3. FIG. 9 is a top view of the second embdiment of FIG. 8, FIG. 10 is a front of view of the same, and FIG. 11 is a cross-sectional side view taken along line B—B designated in FIG. 9. The modified points are apparent by referring to the drawings. The second embodiment has an air filter 12 disposed horizontarlly. The top plate 3 of the storing chamber 7 is eleminated. The filtered clean air flows in a downward direction. Other structural configuration is similar to that of the first embodiment, so further description thereof is omitted. Major part of the filtered air flow is guided into a vertical duct 11 and distributed into a storing space of wafers 5, running along the surfaces of the wafers 5 as indicated by arrows. The air flow distributed between the wafers 5 forms laminated clean air streams. There is an advantage that the structure of the second embodiment has less occupying area than the first embodiment.

The present invention may be embodied in other specific forms without departing from the spirit or essential characteristics thereof. The presently disclosed embodiments are, therefore, to be considered in all respects as illustrative and not restrictive, the scope of the invention being indicated by the appended claims, rather than the foregoing description, and all changes which come within the meaning and range of equivalency of the claims are, therefore, to be embraced therein.

What we claim is:

1. A carrier for storing a plurality of semiconductor wafers in spaced parallel relation comprising:
    a storing chamber having a top plate, a pair of side plates and a bottom plate,
    said side plates having means for supporting a plurality of semiconductor wafers in spaced drelation therebetween,
    said storing chamber being open at both ends and partially open at the bottom
    a housing,
    means connecting said housing to said storing chamber with said housing closing one open end of said storing chamber and defining an air duct adjacent said one end of said storing chamber,
    said housing mounting an air filter between said air duct and said one end of said storing chamber and an electric fan and providing an air inlet to said fan and an outlet from said fan to said air duct and said filter to provide a laminar air flow, and
    an electric power source for said fan, whereby said electric fan will generate a flow of air into said air ducts and through said air filter thereby forming a laminar flow of filtered air across the surfaces of said plurality of spaced semiconductor wafers toward the other open end of said storing chamber.

2. A carrier for storing a plurality of semiconductor wafers as defined by claim 1, wherein said means for supporting said semiconductor wafers are spaced grooves formed parallel to each other on the inner surfaces of said side plates in a direction parallel to said laminar flow of air and have a depth adaptable to receive the peripheral edges of said semiconductor wafers.

3. A carrier for storing a plurality of semiconductor wafers as defined by claim 1, wherein said air filter is a high efficiency particulate air filter.

4. A carrier for storing a plurality of semiconductor wafers as defined by claim 1, wherein said air filter is disposed immediately facing said one end of said storing chamber.

5. A carrier for storing a plurality of semiconductor wafers as defined by claim 1, wherein said housing and said storing chamber are mechanically connected to each other in a demountable manner.

6. A carrier for storing a plurality of semiconductor wafers as defined by claim 1, wherein said electric power source is a secondary battery.

7. A carrier for storing a plurality of semiconductor wafers as defined by claim 6, wherein said secondary battery is a nickel-cadmium (NI-Cd) secondary battery.

8. A carrier for storing a plurality of semicondutor wafers as defined by claim 6 or 7, wherein said housing further includes a charging terminal for charging said secondary battery.

9. A carrier for storing a plurality of semiconductor wafers as defined by claim 8, wherein said housing has a driving terminal for driving said fan from an external power source.

* * * * *